(12) United States Patent
Wright et al.

(10) Patent No.: US 6,649,915 B2
(45) Date of Patent: Nov. 18, 2003

(54) IONIZING RADIATION DETECTOR

(75) Inventors: Gomez W. Wright, Nashville, TN (US); Ralph B. James, Livermore, CA (US); Arnold Burger, Nashville, TN (US); Douglas A. Chinn, Livermore, CA (US)

(73) Assignee: Sandia National Laboratories, Livermore, CA (US)

( * ) Notice: Subject to any disclaimer, the term of this patent is extended or adjusted under 35 U.S.C. 154(b) by 0 days.

(21) Appl. No.: 10/325,995

(22) Filed: Dec. 19, 2002

(65) Prior Publication Data
US 2003/0121885 A1 Jul. 3, 2003

Related U.S. Application Data

(60) Division of application No. 09/536,883, filed on Mar. 28, 2000, now Pat. No. 6,524,966, which is a continuation-in-part of application No. 09/118,691, filed on Jul. 16, 1998, now Pat. No. 6,043,106.

(51) Int. Cl.[7] ................................................. B05D 3/06
(52) U.S. Cl. .............................. 250/370.13; 250/370.01
(58) Field of Search ....................... 250/370.13, 370.01, 250/370.09, 370.14, 385.1, 389

(56) References Cited

U.S. PATENT DOCUMENTS

| | | | | |
|---|---|---|---|---|
| 3,758,796 A | * | 9/1973 | Years | 327/514 |
| 5,391,882 A | * | 2/1995 | Rhiger | 250/370.13 |
| 5,528,495 A | * | 6/1996 | Roscoe | 702/8 |
| 5,627,377 A | * | 5/1997 | Hamilton, Jr. et al. | 250/370.13 |
| 6,168,967 B1 | * | 1/2001 | Hoffbauer et al. | 438/95 |
| 6,218,668 B1 | * | 4/2001 | Luke | 250/370.01 |

* cited by examiner

Primary Examiner—Constantine Hannaher
Assistant Examiner—Otilia Gabor
(74) Attorney, Agent, or Firm—Timothy P. Evans

(57) ABSTRACT

A CdZnTe (CZT) crystal provided with a native CdO dielectric coating to reduce surface leakage currents and thereby, improve the resolution of instruments incorporating detectors using CZT crystals is disclosed. A two step process is provided for forming the dielectric coating which includes etching the surface of a CZT crystal with a solution of the conventional bromine/methanol etch treatment, and passivating the CZT crystal surface with a solution of 10 w/o $NH_4F$ and 10 w/o $H_2O_2$ in water after attaching electrical contacts to the crystal surface.

7 Claims, 8 Drawing Sheets

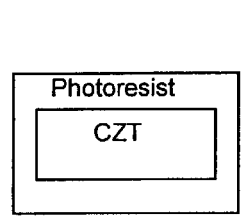

Step1 Spin Photoresist on CZT

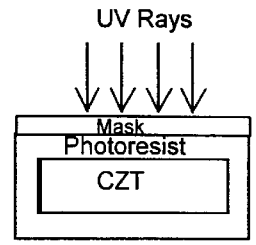

Step2 Mask is placed in contact with Photoresist
Photoresist is irradiated with UV light

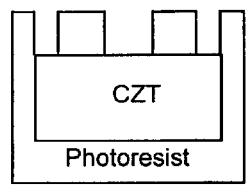

Step3 Photoresist is developed
UV exposed photoresist is removed

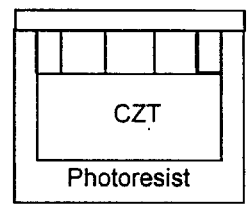

Step4 Gold is deposited on substrate

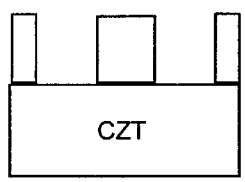

Step5 Photoresist is removed leaving patterned gold contacts

Step6 Pt thin wire with aqua dag or silver epoxy is attached to Gold contact

Step 7 Humiseal protective coating is placed on the electrical lead attachement to Au electrode.

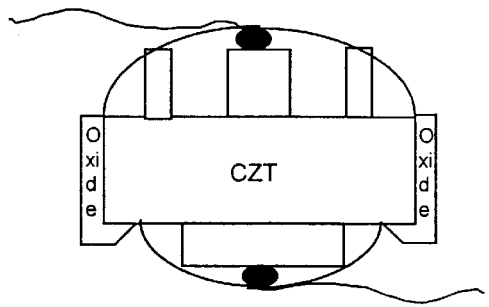

Step8 Native Oxide is formed on CZT

FIG. 4

Step1 Spin Photoresist on CZT
Step2 Mask is placed in contact with Photoresist
Photoresist is irradiated with UV light
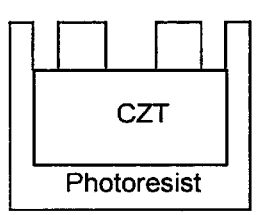
Step3 Photoresist is developed UV exposed photoresist is removed
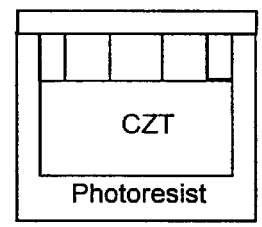
Step4 Gold is deposited on substrate
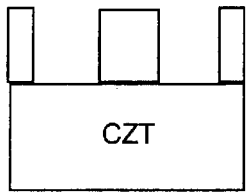
Step5 Photoresist is removed leaving patterned gold contacts separated by oxide
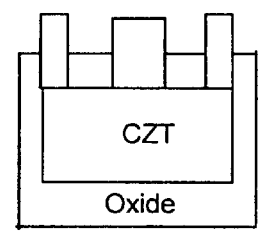
Step6 Native Oxide formed on CZT
FIG. 5A

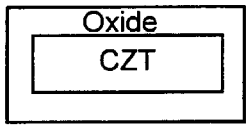

Step 1  Native Oxide formed on CZT

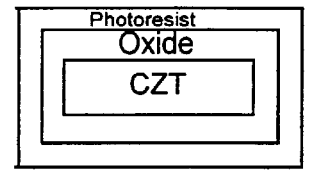

Step 2  Photoresist is spun on Oxide
Subsequently baked

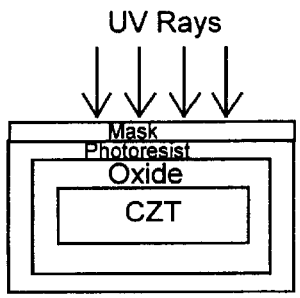

Step 3  Mask is placed in contact with
Photoresist
Photoresist is irradiated with
UV light

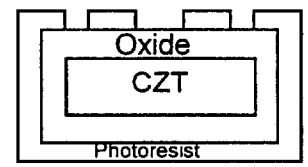

Step 4  Photoresist is developed
UV exposed photoresist is
removed

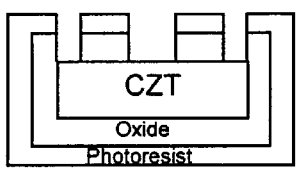

Step 5  Oxide is etched through
pattern photoresist

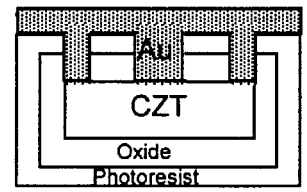

Step 6  Gold is deposited on substrate

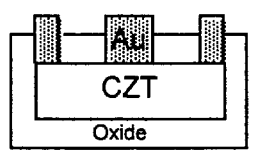

Step 7  Photoresist is removed leaving
patterned gold contacts separated
by oxide

FIG. 6

IONIZING RADIATION DETECTOR

CROSS REFERENCE TO RELATED APPLICATIONS

This application is a division of, and claims priority to, prior U.S. patent application Ser. No. 09/536,883 originally filed Mar. 28, 2000, now U.S. Pat. No. 6,524,966 and entitled "SURFACE TREATMENT AND PROTECTION METHOD FOR CADMIUM ZINC TELLURIDE CRYSTALS," which is itself a continuation-in-part of, and claims priority from, U.S. patent application Ser. No. 09/118,691 titled "METHOD FOR SURFACE PASSIVATION AND PROTECTION OF CADMIUM ZINC TELLURIDE CRYSTALS" filed Jul. 16, 1998 by Mark Mescher, Ralph James, Tuviah Schlesinger, and Haim Hermon, and assigned to Sandia Corporation now U.S. Pat. No. 6,043, 106. The entire disclosure of both U.S. patent application Ser. Nos. 09/536,883 and 09/118,691 is hereby incorporated by reference.

STATEMENT OF GOVERNMENT INTEREST

This invention was made with Government support under government contract no. DE-ACO04-94AL85000 awarded by the U.S. Department of Energy to Sandia Corporation. The Government has certain rights in the invention, including a paid-up license and the right, in limited circumstances, to require the owner of any patent issuing in this invention to license others on reasonable terms.

BACKGROUND OF THE INVENTION

Field of the Invention

This invention pertains generally to methods for improving the performance of detectors for gamma-ray and x-ray spectrometers and imaging systems. More particularly, this invention pertains to a method for treating the surface of CdZnTe detector crystals to reduce leakage currents and increase spectral resolution.

Many of the commonly used radiation detectors employ Si(Li) or Ge semiconductor materials and thus operate most effectively at cryogenic temperatures and under very clean vacuum conditions. The need to operate Si(Li) or Ge-based detectors under these rigorous conditions poses significant limitations on their use for applications where portability is desired.

The general requirements for room temperature operation of semiconducting materials as detectors for spectrometer applications are numerous and in some case contradictory. In particular, in this important that the chosen material exhibit a relatively large band gap energy such that thermal generation of charge carriers is minimized. Conversely, however, a small band gap energy is necessary such that a large number of electron-hole pairs is created for each absorbed quantum of ionizing radiation in order to maximize detector resolution. In addition, the material under consideration should have a relatively high average atomic number when used in gamma ray spectroscopy to increase the gamma ray interaction probability. Lastly, a high charge carrier mobility and long charge carrier lifetime are needed to ensure efficient charge carrier extraction and minimal effects from position dependent charge collection.

CdZnTe (CZT), and particularly $Cd_{1-x}Zn_xTe$ (where x is less than or equal 0.5), is a wide bandgap ternary II–VI compound semiconductor that, because of its unique electronic properties, is desirable for use in room temperature gamma-ray and x-ray radiation detection, spectroscopy, and medical imaging applications. However, the performance of gamma-ray and x-ray spectrometers which employ CZT detector crystals is often limited by surface leakage currents which act as a source of noise that reduces the ability of these spectrometers to spectrally resolve the unique radiological emissions from a wide variety of radioactive isotopes. Thus, in order to improve the spectral resolution capability of devices based on CZT crystals it is desirable to decrease surface leakage currents and the attendant detrimental noise effects.

It is known, in the art, that for a semiconductor crystal to function effectively as a good detector material (i.e., minimizing surface leakage currents, thereby maximizing energy resolution) the crystal surfaces must be properly "treated." Generally speaking, this means chemically etching of the surfaces to eliminate undesirable surface features. Currently, the generally accepted method for surface treatment of CZT crystals is to chemically etch the crystal surfaces in a solution of liquid bromine dissolved in methanol in order to provide a planar surface prior to attachment of electrical contacts. These solutions, or "etchants," are used because they reliably produce surfaces on CZT crystals that are substantially planar and that have a low surface leakage current.

Applicant have also shown that it is possible to markedly reduce leakage current, and therefore noise discrimination, in these crystals by incorporating a passivating layer on the surfaces of the crystal. Such a system is described in co-pending U.S. patent application Ser. No. 09/118,691 wherein a silicon nitride layer is sputtered onto a CZT crystal surface as such a passivating layer.

However, there is a need to reduce the surface leakage current in CZT crystals still further in order to improve spectral resolution. What is required is a method for surface treatment of CZT crystal that will eliminate or reduce surface leakage currents to a level that is presently unattainable using prior art methods.

SUMMARY OF THE INVENTION

CdZnTe (CZT) crystals, particularly $Cd_{1-x}Zn_xTe$ (where x is less or equal 0.5) crystals and preferably $Cd_{0.9}Zn_{0.1}Te$ crystals, are useful for fabrication of small, portable, room temperature radiation detectors. In a first embodiment of the present invention a method is taught for treating a surface or surfaces of CZT crystals that provides a coating on the crystal surface which will reduce surface leakage currents to a previously unattainable level and thereby provide for improved energy resolution in instruments incorporating CZT crystals processed by this invention. A two step process is disclosed, wherein the surface of a CZT crystal is etched the traditional bromine/methanol etch treatment (5 volume percent (v/o) bromine in methanol solution), and after attachment of electrical contacts the surface of the CZT crystal is passivated, preferably by treatment with a aqueous solution of ammonium fluoride and hydrogen peroxide.

A second embodiment of the present invention provides for a surface treatment of CZT crystals that reduces surface leakage currents and simultaneously provides a hard-coat over-layer which prevents performance decay over time due to exposure to moisture and other gases in the working environment, thereby providing for improved energy resolution and reliability. This second embodiment includes the process of the first embodiment followed with an encapsulation technique comprising a low-temperature sputter-deposited silicon nitride overlayer or the application of a polymer seal layer known as HumiSeal® (HumiSeal® is a registered trademark of the Chase Corporation, Woodside, N.Y.).

It is an object of this invention therefore to provide a method for producing a passivating dielectric layer on the surface of a CZT crystal.

It is another object of this invention to provide a method for producing a thick, dense, coherent dielectric layer on the surface of a CZT crystal.

Yet another object of this invention is to provide an enhanced oxidizing solution treatment for producing a thick, dense, coherent dielectric layer on the surface of a CZT crystal.

Still another object of this invention is to provide a method for passivating a CZT crystal surface by immersing said surface in an oxidizing solution comprising hydrogen peroxide and ammonium fluoride in water.

Yet another object of this invention is to provide a method for passivating a CZT crystal surface by immersing said surface in an oxidizing solution comprising 10 w/o hydrogen peroxide and 10 w/o ammonium fluoride in water.

Another object of this invention is to provide a method for reducing surface current leakage in CZT crystals by factor of about 5 below that achievable by conventional wet chemical methods.

Yet another object of this invention is to provide a CZT detector incorporating a CZT crystal having a thick, dense, coherent native oxide dielectric layer covering all exposed surfaces Yet another object of this invention is to provide a CZT crystal having a dense, coherent oxide coating that consists essentially of cadmium oxide.

Another object of this invention is to provide a CZT crystal having an oxide coating which at least greater than about 250 Å.

Still another object of this invention is to provide a high resistivity CZT crystal having a surface current leakage below about 0.01 nA.

A further object of this invention is the application of moisture barrier over the passivating layer such as either a low-temperature sputter-deposited overlayer or a moisture impermeable polymer layer.

BRIEF DESCRIPTION OF THE DRAWINGS

FIG. 2A shows a magnified portion of FIG. 2A.

FIG. 4 shows a conventional method for attaching electrode contacts to CZT crystals followed by a prior art method for sealing/passivating the exposed crystal surfaces to reduce surface current leakage.

FIG. 5A illustrates a photolithographic method for forming an electrode on a CZT crystal surface followed by forming a passivating layer on the exposed crystal surfaces by using the method of the instant invention.

FIG. 6 shows a photolithographic method for forming an electrode on a CZT crystal surface where the entire crystal is first passivated by the method of the instant invention and where a pattern is subsequently etched through the oxide layer to expose a portion of the crystal surface onto which an electrode contact is deposited.

DETAILED DESCRIPTION OF THE INVENTION

Figure 1:
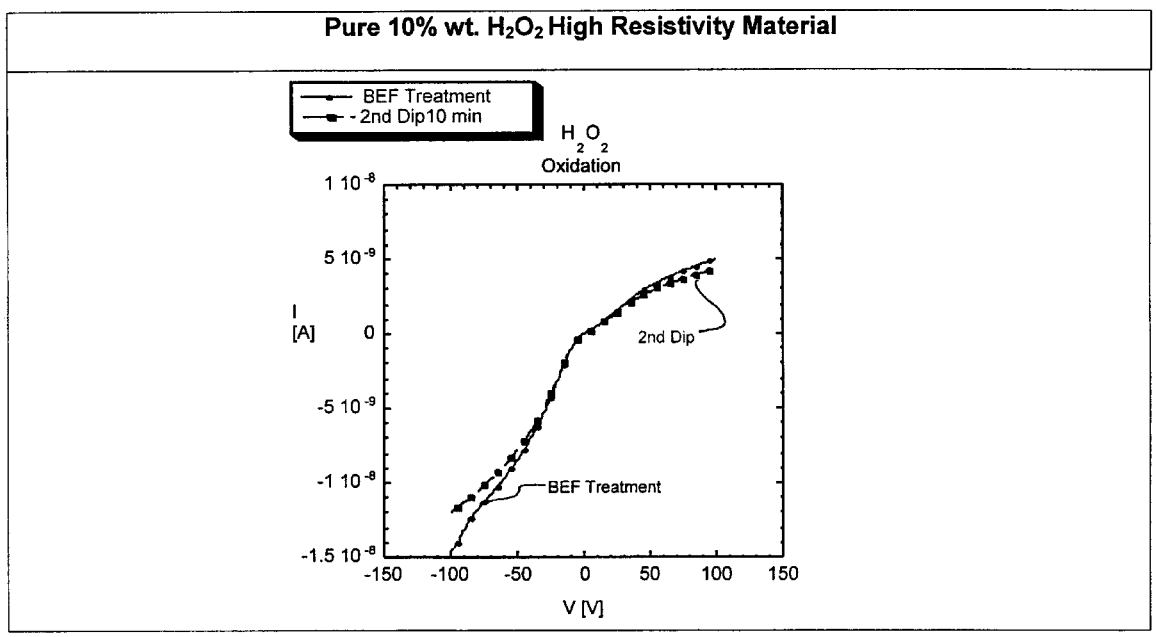
FIG. 1 shows current/voltage curves for CZT crystals etched and passivated using the conventional prior art method of bromine/methanol etching followed by hydrogen peroxide passivation.

The present invention provides a novel and nonobvious method for preparing a CZT crystal having a low value of leakage current which is unattainable with present surface treatment methods. The new process disclosed herein comprises etching the surface of a CZT crystal, particularly a $Cd_{1-x}Zn_xTe$ (where x is less or equal 0.5) crystal, and preferably a $Cd_{0.9}Zn_{0.1}Te$ crystal, with a conventional solution of a 5 v/o bromine/methanol etch, applying electrical contacts, and finally passivating the surface of the etched CZT crystal, preferably with a aqueous solution of an ammonium salt such as ammonium fluoride and hydrogen peroxide although, other halide ammonium salts, include $NH_4F$, $NH_4Cl$, $NH_4Br$, $NH_4I$, are also believed to be effective.

It is believed that surface leakage currents are dominated by two effects: 1) the multiplicity of grain boundaries in polycrystalline CZT at which electrically active tellurium precipitates, and 2) the presence of a thin layer of non-stoichiometric material on the etched crystal surface which has an electrical resistivity much lower than the underlying bulk crystal material, the latter arising from the damage done in cutting and polishing the crystal.

Unfortunately, chemical etchants do not act uniformly on all the individual constituents of alloys such as CZT, and generally leave behind regions of non-stoichiometric material. In the case of CZT crystals etched in the conventional 5 v/o bromine/methanol solution, this non-stoichiometric material is believed to be a tellurium-rich surface layer having a conductivity that is substantially greater than the underlying stoichiometric CZT material. Since leakage current is proportional to electrical conductivity, it is desirable to remove this non-stoichiometric material from the crystal surface.

The surface of a CZT crystal could be improved, therefore, by one or a combination of the following three processes: 1) selectively removing the electrically active species at the crystal surface, typically by an etching process; 2) chemically converting the active species to a molecular compound having dielectric properties; and 3) increasing the reaction rates of 2) such that the quantity of reaction product produced is enough to consume the surface layer damaged by cutting/polishing and the non-stoichiometric layer produced by etching.

The present state of the art teaches forming an oxide layer on the surface of the CZT material. Oxides are known to be insulating materials with normal wide band gaps, high dielectric constant, high resistivity. Furthermore, oxides exhibit chemical stability in most non-acidic aqueous environments. Oxides have been grown from the native surface of CZT by various methods. Some of those methods include:

1) wet chemical production of reaction products at the CZT surface; 2) introduction of the CZT surface to an oxygen plasma; and, 3) bombardment of the CZT surface with oxygen anions.

However, it has been found that the long-term stability of these oxides degrades with time. This may be due in part by the relatively thin layer produced by these methods. For example, the wet chemical oxidizing process utilizing $H_2O_2$ provides an oxide layer ranging in thickness from only about 20 Å to 40 Å. It is believed that if the "as-grown" native dielectric is not thick enough it will not consume enough of the CZT surface to etch that surface. Thin oxide/dielectric films, therefore, primarily passivate through a process of changing electrically active defects on the surface of a semiconductor crystal to molecular species having favorable electrical characteristics. However, this process inherently results in a native oxide that is not uniformly distributed spatially which means that the density of the oxide film produced by the process is reduced, giving rise to a higher diffusion coefficient for reactive species through the layer. The higher diffusion coefficient of the dielectric layer means that reactive species, especially molecular oxygen and water vapor, can quickly diffuse through the layer giving rise to a continuous and on-going reaction at the interface of the dielectric layer and CZT. This diffusion-feed reaction through the dielectric layer creates instability in the oxide/dielectric layer interface with time and/or applied bias ultimately leading to a degradation of device performance. More importantly, the density of interface states, i.e., positive and/or negative charges trapped at the interface, arising as the result of structural or oxidation induced defects, or due to the presence of metal impurities, will be non-uniformly distributed allowing for the dielectric strength of the oxide/dielectric layer to be compromised.

The present invention solves these two problems by a new process which includes etching the surface of a CZT crystal with a conventional $Br_2$/methanol etchant to remove features having a high radius of curvature, followed immediately by applying electrical contacts to the surface of the CZT crystal, (particularly electroless gold and preferably gold electrodes deposited by thermally evaporation or sputtering process), and subsequently forming an oxide layer on the surface of the CZT crystal having the electrical contacts. The final step of forming the oxide layer is performed preferably by immersing the CZT crystal surface in a ammonium fluoride/hydrogen peroxide aqueous solution (10 weight percent (w/o) $NH_4F$ and 10 weight percent (w/o) $H_2O_2$ in water) for about ten (10) minutes. The density, thickness, mechanical stability, and adherence properties of the $NH_4F/H_2O_2$ derived oxide layer has been found to be far superior to the amorphous oxides formed by other methods.

It is believed that the hydrogen peroxide oxidizes the ammonium fluoride forming thereby hyponitrous acid ($H_2N_2O_2$), fluorine gas ($F_2$), and di-fluorine oxide gas ($F_2O$). It is also believed that not all of the ammonium fluoride is oxidized. This then leaves some remaining as free ammonium ($NH_4^+$) and fluoride ($F^-$) ions in solution which are thought to aid in the formation of fluoride compounds of the elemental constituents of CZT, ($CdF_2$, $ZnF_2$, $TeF_4$, and $TeF_6$) as the crystal surface is consumed. Finally, the formation of these halide compounds provides an essential, intermediate step in the formation of the dielectric oxide layer since the direct oxidation of the CZT surface is known to be kinetically unfavorable. By attacking the crystal surface to form intermediate halide compounds at the CZT surface, the unoxidized ammonium fluoride has, in effect, replaced an unfavorable reaction, that of direct oxidation of the pure CZT, with one that is favorable: the decomposition of the halide compounds into their corresponding oxides, particularly cadmium.

The instant process, therefore, provides a primary dielectric layer which has been shown to be substantially a bulk layer of CdO. This is an important result in that CdO is known to have a very high density and exhibits the best lattice match with CZT of the several constituent oxides and would be expected therefore to provide an inert and stable protective layer. These findings have been verified through qualitative analysis utilizing Auger Electron Spectroscopy depth profiling measurements which reveals that the new passivation solution forms a robust dielectric layer on the surface of the CZT crystal about 300 Å–450 Å thick and is comprised substantially of CdO with a thin outside layer of tellurium oxide (either TeO or $TeO_2$) believed to result from the oxidation of the out-diffusion of tellurium hexafluoride ($TeF_6$). Since the tellurium hexafluoride is known to exist as a gas at room temperature its presence therefore provides a possible mechanism for the preferential depletion of Te from the etched CZT crystal surface and the subsequent oxidization of cadmium to cadmium oxide (CdO): This is believed to allow for a countercurrent in-diffusion of $O^{2-}$, provided primarily through the in-diffusion of water molecules or left over hydrogen peroxide, driven by the concentration gradient produced by the displacement of $Te^{2-}$ from the CZT crystal surface in the form of tellurium hexafluoride.

EXAMPLES

As can be seen from experimental results, summarized in TABLE 1 below, CZT crystals that are treated using the conventional prior art treatment have a smaller reduction in surface leakage current than those treated with the $NH_4F/H_2O_2$ treatment. In order to perform a set of passivation experiments to quantify the surface leakage current between various passivation methods CZT crystal samples were selected, etched in a 5 v/o bromine in methanol solution, rinsed in deionized water and dried in a stream of nitrogen gas. The samples of both high and low resistivity CZT material were tested. Circular gold electrodes were attached to front and back faces of the etched crystals and a initial current-voltage measurement taken to establish a baseline. Crystals were then dipped repeatedly into passivating solutions of either the conventional 10 w/o hydrogen peroxide solution, or the ammonium fluoride/hydrogen peroxide solution of the present invention. Each dip immersion was timed for an interval of 5 minutes after which the processed crystals were rinsed and dried as before, and subjected to subsequent current-voltage measurements to obtain a comparative measure of surface current leakage performance against the baseline measurement.

The accompanying FIGURES illustrate the observed change in leakage current with increasing bias voltage for various crystal types and treatments.

Figures 2A, 2B:
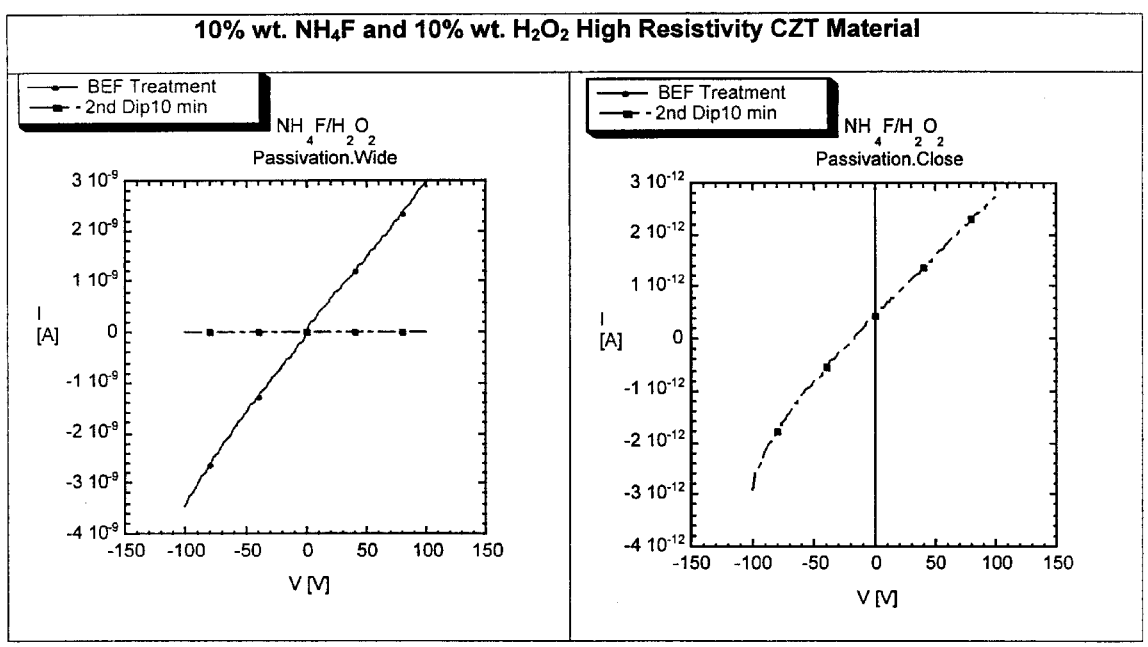
FIG. 2A shows current/voltage curves for high resistivity CZT crystals etched and passivated using the $NH_4F/H_2O_2$ surface treatment method of the instant invention.
Figures 3A, 3B:
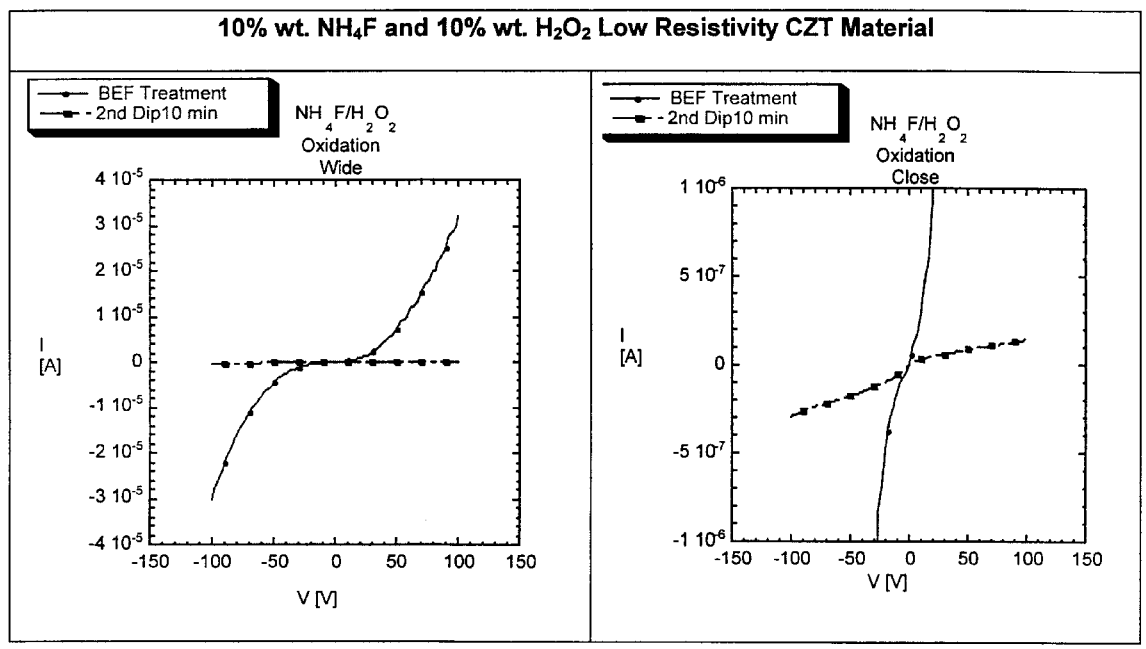
FIG. 3A shows current/voltage curves for low resistivity CZT crystals etched and passivated using the $NH_4F/H_2O_2$ surface treatment method of the instant invention.
FIG. 3B shows a magnified portion of FIG. 3A.

Representative measurements are summarized in the TABLE below. In particular, a comparison of FIGS. 2 and 3 with FIG. 1 shows that the step of growing a dielectric layer using the new oxidative process provides a substantial improvement over the conventional peroxide passivation method. As can be seen in the tabulated summary in TABLE 1 this improvement amounts to decrease in leakage current in both the low and high resistivity materials used in the experiment of several hundred percent.

TABLE 1

Comparison of experimental results obtained with different oxidant solutions, and with different semiconductor materials

| Passivating Treatment Following Etching in Br/MeOH | Initial Resistance [Ω] $R_i$ | Final Resistance [Ω] $R_f$ | Factor of Increase in R ($R_f/R_i$) | Initial Leakage Current [nA] $I_i$ | Final Leakage Current [nA] $I_f$ | % Reduction of Leakage Current | Factor of decrease in I ($I_i/I_f$) |
|---|---|---|---|---|---|---|---|
| $H_2O_2$ High Resistance Material (prior art) | $2.81 \times 10^{10}$ | $3.78 \times 10^{10}$ | 1.35 | 4.96 | 4.1 | 19 | 1.21 |
| $NH_4F/H_2O_2$ High Resistance Material | $3.30 \times 10^{10}$ | $4.45 \times 10^{13}$ | 1349 | 1.48 | $1.59 \times 10^{-3}$ | 99.9 | 927 |
| $NH_4F/H_2O_2$ Low resistance Material | $2.06 \times 10^{6}$ | $9.02 \times 10^{8}$ | 437 | $3.2 \times 10^{4}$ | 142 | 99.6 | 225 |

FIG. 1 shows the leakage current vs. voltage curves for CZT crystals treated by the prior art method of etching the crystal in a 5 v/o solution of bromine in methanol for 2 minutes followed by passivating the crystal in hydrogen peroxide. These measurements where made by attaching platinum leads, having a diameter of about 0.01 mm, using Aquadag (graphite suspension in water) to gold contacts deposited onto the CZT surface by thermal evaporation, following the step of etching. The entire assembly was then covered with a protective coating, such as HumiSeal® supplied by the HumiSeal Division of the Chase Corporation. The current-voltage measurements shown in FIG. 1 were made at room temperature using, by way of example, a Keithley Model 617 programmable electrometer in conjunction with a Bertan high voltage power supply.

While the conventional step of etching provided herein produces CZT detector crystals having lower leakage currents, the inventors have found that it is possible to further reduce the leakage current, and thus the noise level, and improve the sensitivity and spectral resolution of radiation detectors employing CZT crystals by passivating the surface of an etched CZT crystal; particularly with a solution of ammonium fluoride and hydrogen peroxide in water and preferably with a solution of 10 w/o ammonium fluoride and 10 w/o hydrogen peroxide in water subsequent to the steps of etching and applying electrodes to a CZT detector crystal.

FIGS. 2A and 2B and FIGS. 3A and 3B, (where FIG. B in each case illustrates a magnified view of FIG. A), shows the marked improvement in leakage current reduction of CZT materials processed by the present invention as is seen be the wide difference in slopes of the before-and-after current-voltage measurements. Actual device resistance and leakage current, measured under an electrical bias of 100V, for low resistance and high resistance CZT material is shown in TABLE 1.

It can be seen that treating the surface of a CZT crystal with a solution of 10 w/o $NH_4F$ and 10 w/o hydrogen peroxide in water serves to reduce significantly the surface leakage current of the treated CZT crystal. Providing a dielectric coating by oxidizing the surface of etched CZT crystals substantially reduces surface leakage currents by reducing the effect of high conductivity residues, such as Te, left on the etched surface at the completion of the etching process. This dielectric coating, grown directly from the CZT surface, allows for the difference in bias voltage between adjacent electrodes, on strip or coplanar grid detectors, to be increased without the onset of catastrophic noise effects thereby increasing the sensitivity and energy resolution of the detector. It is preferred that the ammonium fluoride/hydrogen peroxide solution treatment time be between 5 to 10 minutes.

In summary, the present invention provides a novel method for reducing the leakage current of CZT crystals, particularly $Cd_{1-x}Zn_xTe$ crystals (where x is less or equal 0.5), and preferably $Cd_{0.9}Zn_{0.1}Te$ crystals, thereby enhancing their ability to spectrally resolve radiological emissions from a wide variety of radionuclides. The present method provides for etching the surface of a CZT crystal with a solution of bromine in methanol and subsequently growing a dielectric layer on the crystal surface, preferably with a aqueous solution of ammonium fluoride and hydrogen peroxide.

From the foregoing description, one skilled in the art can readily ascertain the essential characteristics of the present invention. The inventors, however, now wish to describe several modes for carrying out their invention and thereby providing a detector having improved spectral resolution.

As illustrated in FIG. 4 the inventors show a conventional method wherein exposed areas of a crystal detector are passivated after forming electrical contacts. A contact pattern is placed onto the surface of a CZT crystal using standard mask-and-etch photolithographic techniques. Electrical contacts are then deposited onto the exposed surface using any number of known techniques, including CVD, sputtering, and wet chemical methods such as electroless gold plating. Following attachment of leads wires to the contacts the surfaces having metal electrodes deposited on them are coated with a moisture barrier such as HumiSeal®. Remaining exposed surface of the crystal are subsequently passivated by growing a native dielectric/oxide layer thereon by any of the known techniques described above by the inventors or by the process of instant invention.

Embodiment 1

Illustrated in FIG. 5A the inventors show a first mode for providing a passivated CZT crystal in which those exposed areas of a crystal detector not already covered by electrical contacts, are passivated by the ammonium fluoride/ hydrogen peroxide solution treatment of the instant invention. Again, a contact pattern is placed onto the surface of a CZT crystal using standard mask-and-etch photolithographic techniques. Metal contacts are then deposited onto the surface of the CZT crystal exposed by etching away an exposed portion of photoresist. Deposition means are again any suitable technique, including vapor deposition, sputtering, and wet chemical methods such as electroless gold plating. Following formation of these electrical contacts the entire crystal is treated by the process of the present invention.

Figure 5B:
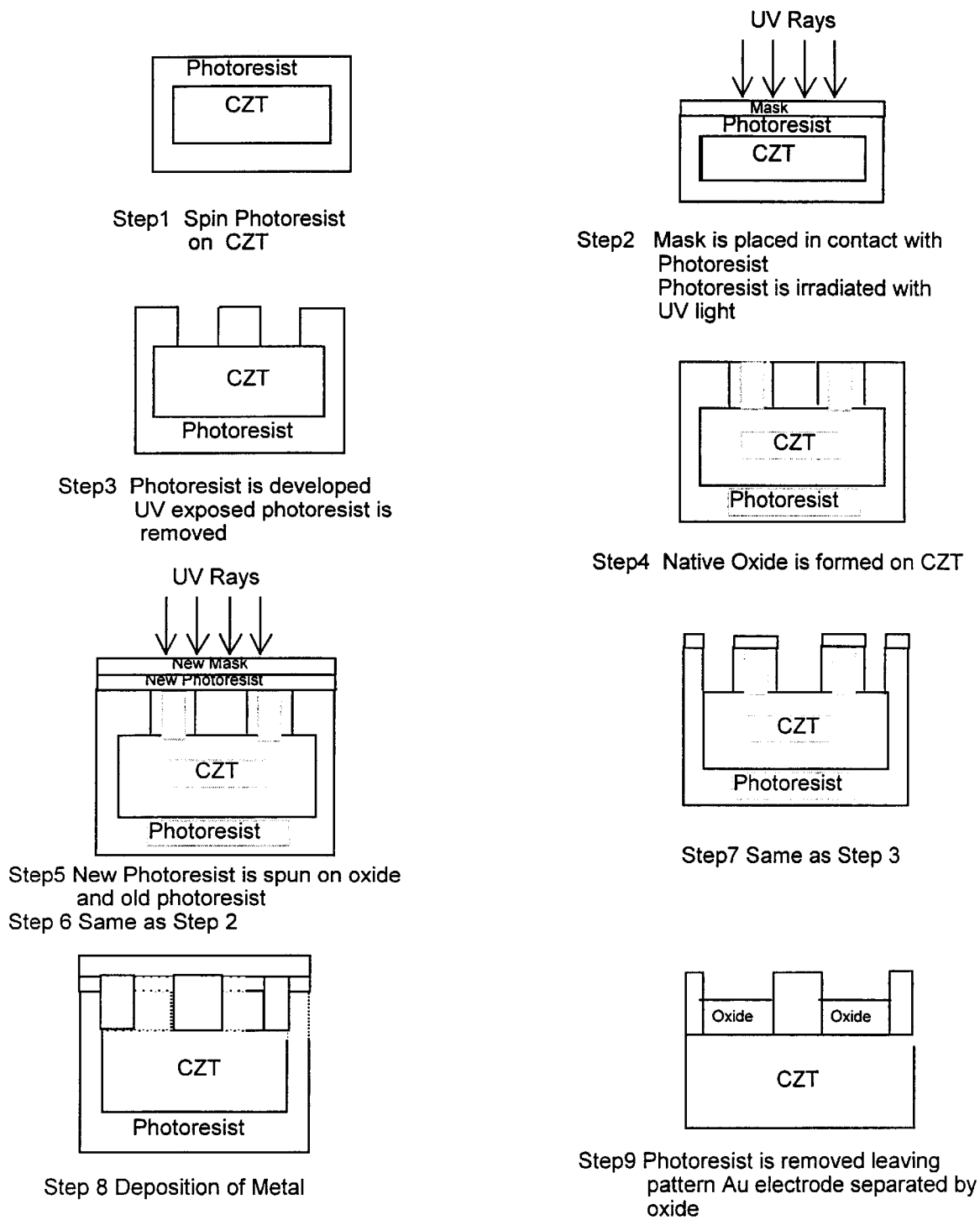
FIG. 5B shows a new method for attaching electrode contacts to CZT crystals comprising forming an patterned oxide layer on a surface of a CZT crystal before forming the electrode followed by forming second pattern between the oxide pattern into which the electrode is deposited.

In a related manner, illustrated in FIG. 5B, an embodiment is shown which comprises forming the native oxide after a first mask-and-etch step instead of forming the electrode contact. This step is then followed by a second mask-andetch step wherein a pattern is created around the oxide layer for the purpose of forming the contact.

The preferred mode for practicing embodiment 1 of the instant invention is illustrated and shown in FIG. 6. A method is disclosed for providing a passivated CZT crystal wherein the passivating, dielectric/oxide layer is incorporated onto the CZT crystal before processing to provide the crystal with electrical contacts. As with the mode illustrated in FIG. 5, a contact pattern is placed down onto surfaces of the CZT crystal using known mask and etch photolithographic techniques. In the preferred best mode, however, the pattern is created into the native oxide film already grown on the surface of the crystal. This approach provides a means for avoiding potential damage to electrical contacts or to the interfacial zone beneath the contacts by the peroxide/ammonium fluoride passivating solution of this invention.

Embodiment 2

A second embodiment comprising applying an encapsulating coating over the previously passivated crystal surfaces.

It is known that various gases present in the atmosphere, especially water vapor, can have a deleterious effect on the long-term stability of the CZT crystal surface and passivating layer. In order to prevent or at least minimize the chemical reaction of these species with the CZT crystal surface. The inventors have discovered that the application of a layer of a polymer material known as HumiSeal® to the CZT crystal provides an effective barrier to these gaseous species. The inventors have found that an effective layer of this material may be applied by simply dipping the passivated crystal into the liquid HumiSeal® polymer for between 1 and 20 seconds after electrical leads have been attached.

The inventors have also noted in related, co-pending U.S. patent application Ser. No. 09/118,691, that by a depositing a hard-coat silicon nitride layer onto the CZT crystal surface after that surface has been passivated and after electrode patterning and deposition a similarly effective barrier is provided. That is, after oxidizing the CZT surface via the ammonium fluoride/hydrogen peroxide solution treatment of embodiment 1 a silicon nitride layer is applied which further enhances the passivating capability of this technique. This method, therefore, provides a novel process wherein a thin hard-coat overlayer (nominally 1000 Å thick) of reactively-sputtered silicon nitride is laid down onto the passivated CZT surface. It is postulated that this overlayer prevents conduction induced by moisture or other gases in the operating environment. The conditions used for this process are shown below in Table 2.

TABLE 2

Deposition conditions for sputtered silicon nitride on CZT.

| Pressure | $N_2$ flow | Ar flow | RF Power | Target bias |
|---|---|---|---|---|
| 5.5 mTorr | 6 sccm | 21 sccm | 100 Watts | −300 Volts |

These parameters were chosen to mimic those found in the prior art to be optimal in terms of stoichiometry, refractive index, and residual stress. However, the properties of reactively sputtered films are significantly dependent on the characteristics of a particular sputtering system. Because the instant invention utilizes a system different from the prior art system in which the silicon nitride films were optimized, it is not clear to what extent the electrical properties of these particular silicon nitride films were similarly optimized. It is thus highly probable that improved passivation with silicon nitride alone can be achieved with optimization of the silicon nitride deposition process.

Figure 7:
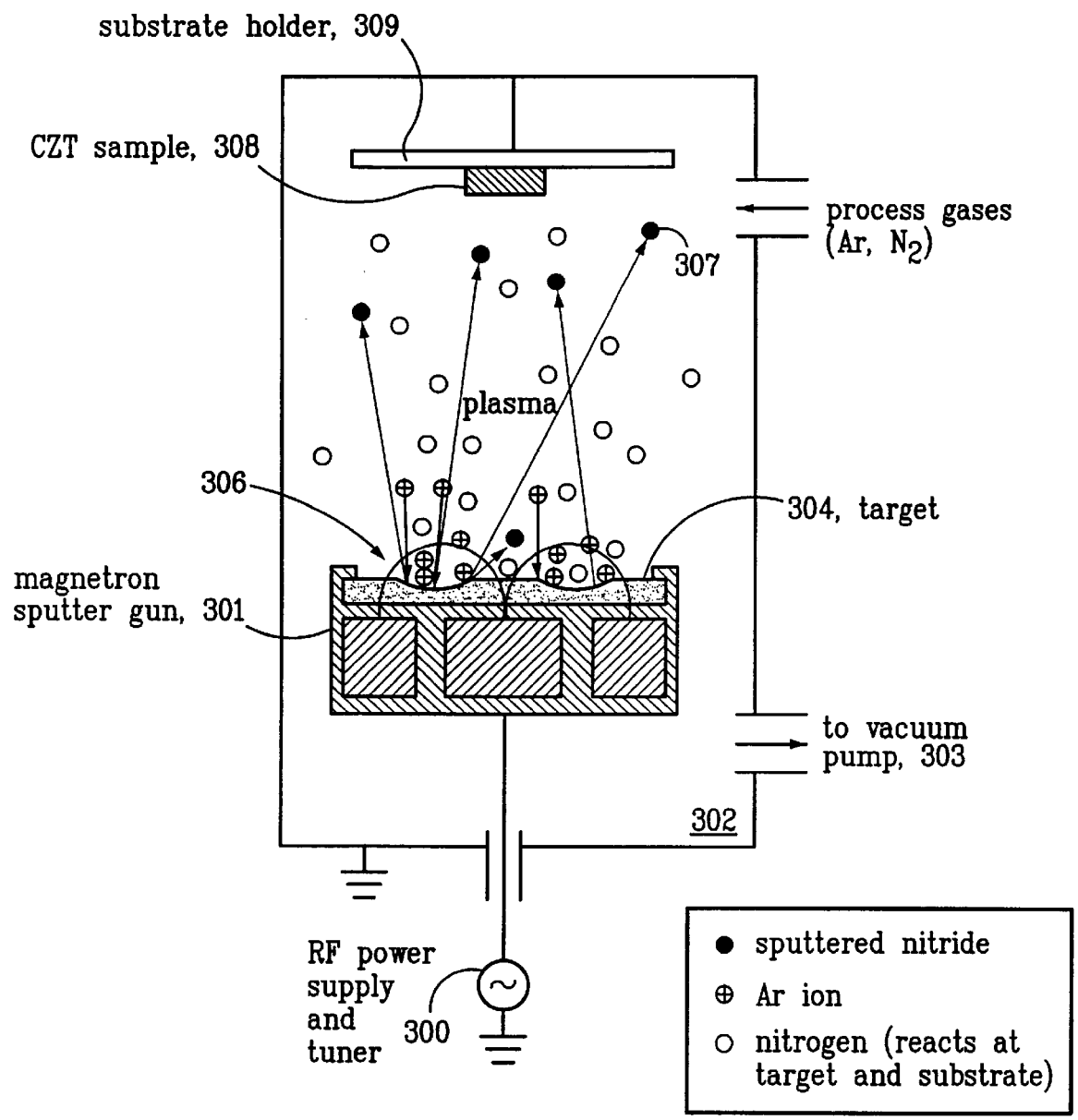
FIG. 7 illustrates a simplified view of a magnetron sputtering system.

The sputter process itself is conventional. A diagrammatic sketch of the process is shown in FIG. 7. Radio frequency (RF) power supply 300 is attached to a standard magnetron sputter gun 301 which is itself held within a high vacuum chamber 302 connected to a high speed, cryo-pump vacuum pump 303. A target element 304 is held in the sputter gun in electrical contact with the RF source 300. Argon and Nitrogen process gas is admitted into chamber 302 at which point the argon atoms 305 are ionized by the RF field (not shown) and accelerated toward target 304. The high energy magnet in gun 301 retains the argon ion 305 in a looping circulation pattern 306 which brings them repeated into contact with target 304. As these high energy ions strike the surface of target 304, material is dislodged and ejected by a momentum transfer process. As the target surface is "cleaned" by the action of the argon plasma the added nitrogen gas reactions with this surface to form a nitride layer. It is this layer which eroded by the plasma, dislodged as nitride fragments 307 and ejected with enough energy to travel to the surface of the passivated CZT crystal 308, attached to substrate holder 309, which is to be coated.

A hard-coat silicon nitride layer is thus deposited onto the passivated and oxidized surface of the CZT crystal. Other dielectric nitride films known to those skilled in the art of reactive sputtering processes can provide surface passivation for CZT crystals. Potential candidates, beyond that of silicon nitride, include boron nitride, germanium nitride, aluminum nitride and gallium nitride. Significant variation in the parameters used for both the silicon nitride deposition steps may also yield processes which provide significant passivating capability.

In summary, the present invention provides a novel method for reducing the leakage current of CZT crystals, particularly $Cd_{1-x}Zn_xTe$ (where x is greater than or equal to zero and less than or equal 0.5), and preferably $Cd_{0.9}Zn_{0.1}Te$ crystals. The present method provides for depositing, via reactive sputtering, a silicon nitride hard-coat overlayer which protects the surface of CZT crystals passivated by the ammonium fluoride/hydrogen peroxide solution treatment of the present invention from moisture and other gases in the operating environment.

The reader will appreciate that the foregoing description is only intended to be illustrative of the present invention and is, therefore, not to be construed to limitation or restriction thereon, the invention being delineated in the following claims.

What is claimed is:

1. An ionizing radiation detector, comprising:

a CdZnTe crystal having one or more surfaces; and a passivating dielectric layer grown on said surfaces, said layer consisting essentially of CdO.

2. The detector of claim 1, wherein the passivating layer is about at least 250Å thick.

3. The detector of claim 1, further including an insulating means for providing a barrier between said dielectric layer and gases present in ambient air.

4. The detector of claim 3, wherein said insulating means includes a polymer layer on said dielectric layer.

5. The detector of claim 3, wherein said insulating means includes a reactively sputtered hard-coat nitride layer deposited on said dielectric layer.

6. The detector of claim 5, wherein the hard-coat nitride layer is selected from the group consisting essentially of silicon nitride, boron nitride, germanium nitride, aluminum nitride, or gallium nitride.

7. The detector of claim 1, wherein the presence of the passivating dielectric layer reduces an initial measurement of surface current leakage by at least two orders of magnitude.

* * * * *